(12) United States Patent
Chen et al.

(10) Patent No.: US 10,755,972 B2
(45) Date of Patent: Aug. 25, 2020

(54) SEMICONDUCTOR DEVICE AND METHOD

(71) Applicant: Taiwan Semiconductor Manufacturing Company, Ltd., Hsinchu (TW)

(72) Inventors: Nai-Chia Chen, Hsinchu (TW); Chun-Li Chou, Jhubei (TW); Yen-Chiu Kuo, Tainan (TW); Yu-Li Cheng, Tainan (TW); Chun-Hung Chao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 324 days.

(21) Appl. No.: 15/464,057

(22) Filed: Mar. 20, 2017

(65) Prior Publication Data

US 2018/0151421 A1 May 31, 2018

Related U.S. Application Data

(60) Provisional application No. 62/427,460, filed on Nov. 29, 2016.

(51) Int. Cl.
*H01L 21/768* (2006.01)
*H01L 21/311* (2006.01)

(52) U.S. Cl.
CPC .. *H01L 21/76831* (2013.01); *H01L 21/31111* (2013.01); *H01L 21/31144* (2013.01); *H01L 21/76813* (2013.01); *H01L 21/76832* (2013.01); *H01L 21/76883* (2013.01); *H01L 21/76834* (2013.01); *H01L 2221/1047* (2013.01)

(58) Field of Classification Search
CPC ......... H01L 21/76831; H01L 21/31144; H01L 21/76883; H01L 21/31111; H01L 21/76813
See application file for complete search history.

(56) References Cited

U.S. PATENT DOCUMENTS

| | | | | |
|---|---|---|---|---|
| 2004/0048203 A1* | 3/2004 | Furusawa | ......... | H01L 21/02063 430/314 |
| 2010/0190347 A1* | 7/2010 | RamachandraRao | ....................... | H01L 21/02068 438/703 |
| 2014/0308810 A1* | 10/2014 | Ko | .......... | H01L 21/475 438/653 |
| 2015/0041879 A1* | 2/2015 | Jayanti | .............. | H01L 21/28282 257/324 |
| 2015/0097293 A1* | 4/2015 | Yao | .................... | H01L 21/76802 257/773 |
| 2015/0270225 A1* | 9/2015 | Yang | ................. | H01L 23/53276 257/750 |

* cited by examiner

*Primary Examiner* — Mohammed R Alam
(74) *Attorney, Agent, or Firm* — Slater Matsil, LLP

(57) ABSTRACT

A semiconductor device and method of manufacture comprise placing an etch stop layer of a material such as aluminum oxide over a conductive element, placing a dielectric layer over the etch stop layer, and placing a hardmask of a material such as titanium nitride over the dielectric layer. Openings are formed to the etch stop layer, the hardmask material is selectively removed, and the openings are then the material of the etch stop layer is then selectively removed to extend the openings through the etch stop layer.

20 Claims, 5 Drawing Sheets

SEMICONDUCTOR DEVICE AND METHOD

PRIORITY CLAIM

This application claims the benefit of U.S. Provisional Application No. 62/427,460, filed on Nov. 29, 2016 and entitled "Semiconductor Device and Method," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
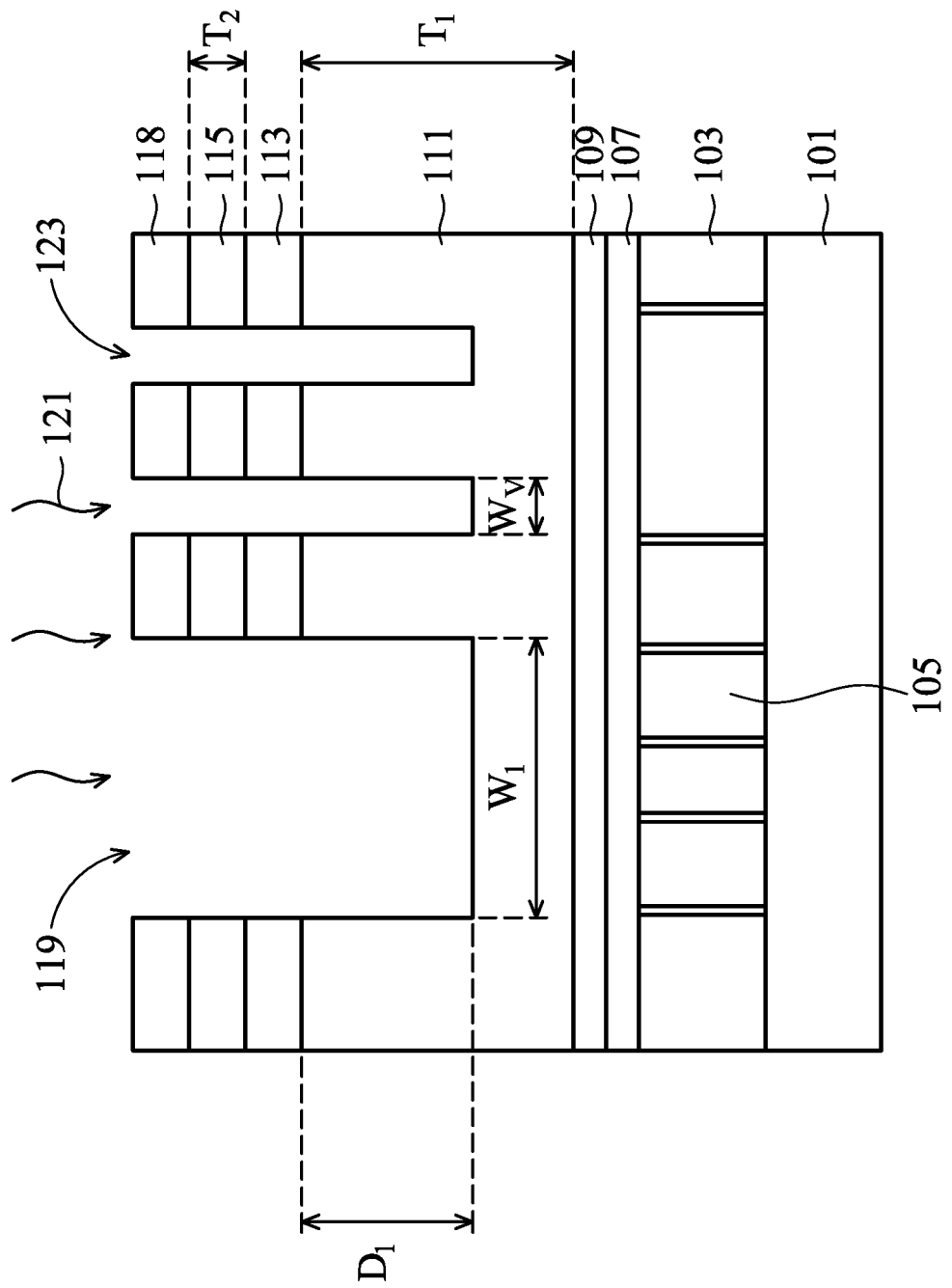
FIG. 1 illustrates a patterning of a dielectric layer to form a trench opening in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, FIG. 1 illustrates a substrate 101 with active devices (not separately illustrated), metallization layers 103 over the substrate 101, conductive elements 105 within the metallization layers 103, a first etch stop layer 107, a second etch stop layer 109, and a first dielectric layer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to four layers of metallization separated from the substrate 101 by at least one interlayer dielectric layer (ILD), but the precise number of metallization layers is dependent upon the design.

The conductive elements 105 may be formed in an upper portion of the metallization layers 103, and is a region to which an interconnect 501 (not illustrated in FIG. 1 but illustrated and described below with respect to FIG. 5) will make physical and electrical connection. In an embodiment the conductive elements 105 may be a material such as copper formed using, e.g., a damascene or dual damascene process, whereby an opening is formed within an upper portion of the metallization layers 103, the opening is filled and/or overfilled with a conductive material such as copper, and a planarization process is performed to embed the conductive material within the metallization layers 103. However, any suitable material and any suitable process may be used to form the conductive elements 105.

A first etch stop layer 107 is used to protect the underlying structures and provide a control point for a subsequent etching process through, e.g., the second etch stop layer 109. In one embodiment, the first etch stop layer 107 may be formed of silicon nitride using plasma enhanced chemical vapor deposition (PECVD), although other materials such as nitride, carbide, boride, combinations thereof, or the like, and alternative techniques of forming the first etch stop layer 107, such as low pressure CVD (LPCVD), PVD, or the like, could alternatively be used. The first etch stop layer 107 may have a thickness of between about 50 Å and about 2,000 Å, such as about 200 Å.

Once the first etch stop layer 107 has been formed to cover the conductive elements 105, the second etch stop layer 109 is formed over the first etch stop layer 107. In an embodiment the second etch stop layer 109 is formed of a material such as aluminum oxide, although any suitable material, such as aluminum nitride, may also be used. The material of the second etch stop layer 109 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the second etch stop layer 109 has been formed, the first dielectric layer 111 may be formed in order to help isolate the interconnect 501 from other adjacent electrical routing lines. In an embodiment the first dielectric layer 111 may be, e.g., a low-k dielectric film intended to help isolate the interconnect 501 from other structures. By isolating the interconnect 501, the resistance-capacitance (RC) delay of the interconnect 501 may be reduced, thereby improving the overall efficiency and speed of electricity through the interconnect 501.

In an embodiment the first dielectric layer 111 may be a porous material such as SiOCN, SiCN or SiOC and may be formed by initially forming a precursor layer over the second etch stop layer 109. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the metallization layers 103, may also be utilized.

The precursor layer may be formed to a thickness sufficient to provide the isolation and routing characteristics that are desired of the first dielectric layer 111. In an embodiment, the precursor layer may be formed to a first thickness $T_1$ of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the first dielectric layer 111. The porogen may be a material that is big enough to form the pores while also remaining small enough such that the size of the individual pores does not overly displace the matrix material. As such, the porogen may comprise an organic molecule such as a methyl containing molecular or an ethyl containing molecule.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 111. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the first dielectric layer 111. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

FIG. 1 additionally illustrates a placement of an anti-reflective layer 113. In an embodiment the anti-reflective layer 113 may be a nitrogen-free anti-reflective coating and may comprise a polymer resin, a catalyst, and a cross-linking agent, all of which are placed into a solvent for dispersal. The polymer resin comprises a polymer chain with repeating units, such as a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, sulfur, or combinations thereof, such as pyranyl or acridinyl. The substituents in these units may be any hydrocarbyl group and may further contain heteroatoms, such as, oxygen, sulfur or combinations thereof, such as alkylenes, ester, ethers, combinations of these, or the like, with a number of carbon atoms between 1 and 12.

The cross-linking monomer may be used to cross-link the monomer with other polymers within the polymer resin to modify the solubility of the anti-reflective layer 113, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like.

The catalyst may be a compound that is used to generate a chemically active species and initiate a cross-linking reaction between the polymers within the polymer resin and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the anti-reflective layer 113. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

The cross-linking agent may also be added to the anti-reflective layer 113. The cross-linking agent reacts with the polymers within the polymer resin within the anti-reflective layer 113, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

The materials for the anti-reflective layer 113 may be placed into a solvent for dispersal. In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Once the material for the anti-reflective layer 113 has been prepared, the material for the anti-reflective layer 113 may be utilized by initially applying the material for the anti-reflective layer 113 onto the first dielectric layer 111. The material for the anti-reflective layer 113 may be applied to the first dielectric layer 111 so that the material for the anti-reflective layer 113 coats an upper exposed surface of the first dielectric layer 111, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 113 may be applied such that it has a thickness of between about 50 nm and about 500 nm, such as about 300 nm.

Once the anti-reflective layer 113 has been formed, a first hardmask 115 may be formed over the anti-reflective layer 113. In an embodiment the first hardmask 115 may be a masking material with a different etching selectivity from the material of the second etch stop layer 109, such as titanium nitride (TiN), although any other suitable material, such as titanium oxide may be used. The first hardmask 115 may be formed using a deposition process such as chemical vapor deposition, physical vapor deposition, atomic layer deposition, combinations of these, or the like, and may be formed to an initial second thickness $T_2$ of between about 50 Å and about 800 Å, such as about 300 Å. However, any suitable thickness may be utilized.

Once formed, the first hardmask 115 may be patterned in order to provide a masking layer for a subsequent etching process (e.g. a first etching process 121 described below) to form a trench opening 119. In an embodiment the first hardmask 115 may be patterned by placing a first photoresist 118 over the first hardmask 115 and then exposing and developing the first photoresist 118 to form a patterned photoresist. Once the first photoresist 118 has been patterned, the pattern of the first photoresist 118 is then transferred to the first hardmask 115 using, e.g., an anisotropic etching process such as a reactive ion etching process. However, any suitable process may be utilized.

In an embodiment the first hardmask 115 may be patterned to form a mask for the trench opening 119. As such, the first hardmask 115 may be patterned such that the trench opening 119 has a first width $W_1$ of between about 10 nm and about 300 nm, such as about 40 nm. However, any suitable dimensions may be utilized.

Additionally, while the first hardmask 115 may be patterned to form the trench opening 119, the first hardmask 115 may also be patterned to form second openings 123. In an embodiment the second openings 123 may be formed as part of vias 503 (not illustrated in FIG. 1 but illustrated and described below with respect to FIG. 5) that are formed separately from the interconnect 501. In an embodiment the second openings 123 may be formed to have a via width $W_v$ of between about 10 nm and about 300 nm, such as about 40 nm. However, any suitable dimensions may be utilized.

Once the first hardmask 115 has been patterned, the pattern of the first hardmask 115 may be transferred to the first dielectric layer 111 using a first etching process (represented in FIG. 1 by the wavy lines labeled 121). In an embodiment the first etching process 121 may be, e.g., an anisotropic etching process such as a reactive ion etch with etchants suitable to etch the first dielectric layer 111. However, any suitable etching method or combination of etching methods may be utilized.

By using the first etch process 121 and the first hardmask 115, the pattern of the first hardmask 115 is transferred to the anti-reflective layer 113 and then to the first dielectric layer 111 and the trench opening 119 is formed. In an embodiment the transfer of the pattern from the first hardmask 115 into the first dielectric layer 111 helps to form the trench portion 504 of the first interconnect 501 into the first dielectric layer 111. In a particular embodiment, the trench portion 504 of the interconnect 501 may be formed to extend into the first dielectric layer 111 a first depth $D_1$ of between about 200 Å and about 2000 Å, such as about 800 Å. However, any suitable depth may be utilized.

Figure 2:
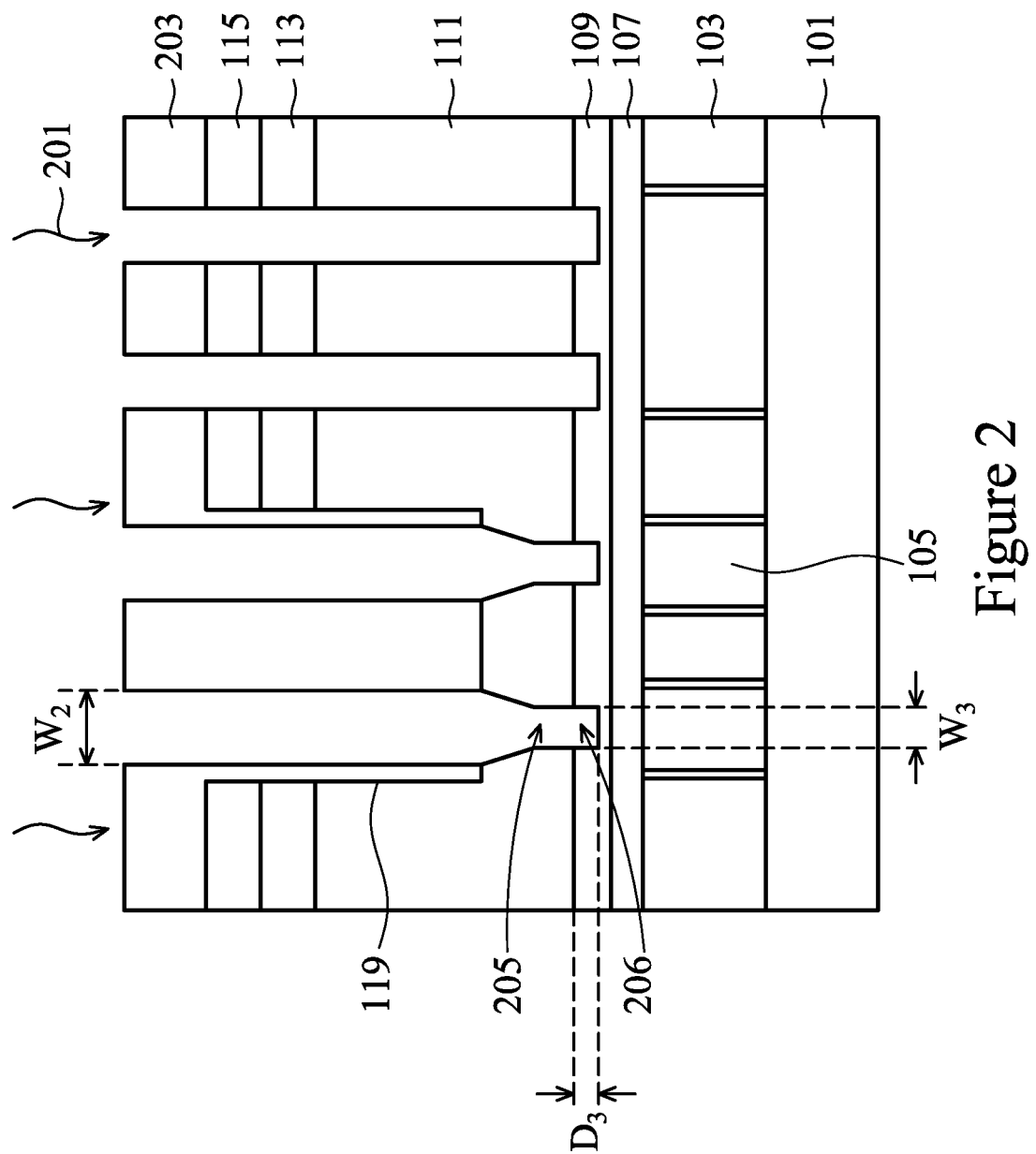
FIG. 2 illustrates a patterning of the dielectric layer to form via openings in accordance with some embodiments.

FIG. 2 illustrates that, once the trench opening 119 has been formed, the first photoresist 118 is removed. In an embodiment the first photoresist 118 is removed using a process such as ashing, whereby the temperature of the first photoresist 118 is increased until the first photoresist 118 experiences a thermal decomposition, at which point the first photoresist 118 may be easily removed. However, any other suitable process, such as a wet or dry etch, or even removing the first photoresist 118 using the same etching process that forms the trench opening 119, may be used.

Once the first photoresist 118 has been removed, a second photoresist 203 may be deposited and patterned to form openings to assist in the patterning of via openings 205 through the trench opening 119. In an embodiment the second photoresist 203 is a tri-layer photoresist, with a bottom anti-reflective coating (BARC) layer, an intermediate mask layer, and a top photoresist layer (not separately illustrated within FIG. 2). However, any suitable type of photosensitive material or combination of materials may be utilized.

Once the second photoresist 203 has been placed over the first hardmask 115 and the trench opening 119, the second photoresist 203 is patterned. In an embodiment the second photoresist 203 may be patterned by exposing a photosensitive material within the second photoresist 203 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photoresist 203 are different from the physical properties of the unexposed portions of the second photoresist 203. The second photoresist 203 may then be developed with, e.g., a developer (not separately illustrated), in order to separate the exposed portion of the second photoresist 203 from the unexposed portion of the second photoresist 203, and the pattern of the top photoresist layer may be extended through the intermediate mask layer and the bottom anti-reflective coating layer.

In an embodiment the second photoresist 203 may be patterned such that the second photoresist 203 can be used to form the via openings 205 through the first dielectric layer 111. As such, the second photoresist 203 may be formed to have openings with a second width $W_2$ of between about 10 nm and about 300 nm, such as about 40 nm. However, any suitable dimensions may be utilized.

Once the second photoresist 203 has been placed and patterned, a second etching process (represented in FIG. 2 by the wavy lines labeled 201) may be used to form via openings 205 which will be filled to form via portions 502 of the interconnect 501. In an embodiment the second etching process 201 may be similar to the first etching process 121. For example, the second etching process 201 may be an anisotropic etching process such as a reactive ion etching process that utilizes etchants that are selective to the first dielectric layer 111.

The second etching process 201 will work to extend the via openings 205 from the trench opening 119 all of the way through the first dielectric layer 111 and will expose the underlying second etch stop layer 109, which material is chosen to stop or at least slow down the second etching process 201 and prevent the second etching process 201 from etching past the second etch stop layer 109. As such, the via openings 205 may extend into, but not through, the second etch stop layer 109 such that a via bottom 206 is located at a third depth $D_3$ of between about 10 Å and about 200 Å, such as about 40 Å, and have a third width $W_3$ at a bottom of the via openings 205 of between about 10 nm and about 300 nm, such as about 40 nm. However, any suitable dimension may be utilized.

Figure 3:
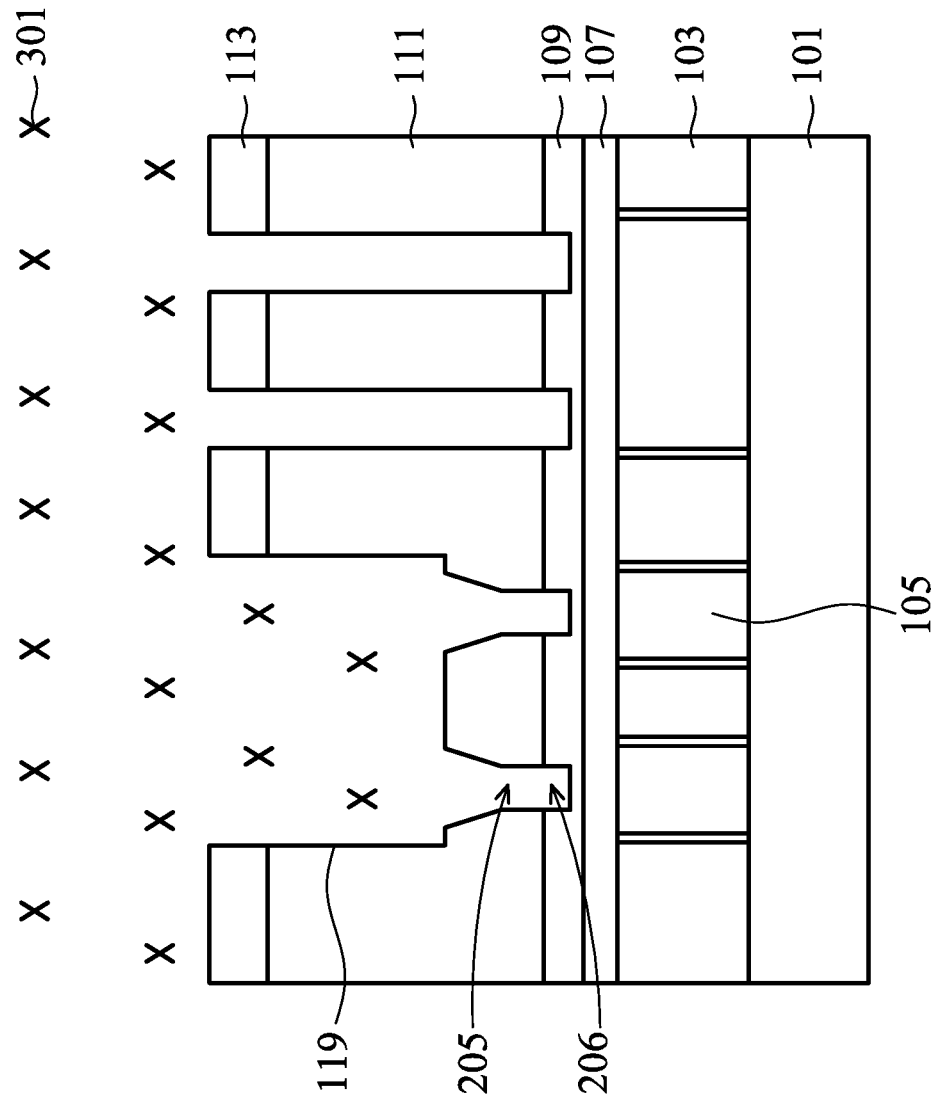
FIG. 3 illustrates a removal of a hardmask in accordance with some embodiments.

FIG. 3 illustrates that, once the second etching process 201 has been completed, the second photoresist 203 and the first hardmask 115 are removed prior to exposure of the conductive elements 105. In an embodiment the second photoresist 203 is removed using a process such as ashing, whereby the temperature of the second photoresist 203 is increased until the second photoresist 203 experiences a thermal decomposition, at which point the second photoresist 203 may be easily removed. However, any other suitable process, such as a wet or dry etch, or even removing the second photoresist 203 using the same etching process that forms the via openings 205, may be used.

Once the second photoresist 203 has been removed, the removal of the first hardmask 115 may be performed using, e.g., a first wet etching process (represented in FIG. 3 by the "X"s labeled 301). In an embodiment the first wet etching process 301 may utilize a liquid first etchant which is brought into contact with the first hardmask 115 along with the remainder of the structure. For example, the first hardmask 115 may be dipped into a liquid pool of the first etchant at a temperature of between about 25° C. and about 80° C., such as about 60° C. However, any suitable method of contacting the first etchant to the first hardmask 115 may be utilized.

Additionally, the first etchant is chosen to selectively remove the material of the first hardmask 115 (e.g., titanium nitride) without substantively removing the material of the second etch stop layer 109 (e.g., aluminum oxide). As such, while the precise material for the first etchant will depend on the material chosen for the first hardmask 115, in an embodiment in which the first hardmask 115 is titanium nitride and the second etch stop layer 109 is aluminum oxide, the first etchant may comprise hydrogen peroxide in an organic solvent such as ethylene glycol, propylene glycol monomethyl ether, diethylene glycol monoethyl ether, diethylene glycol monobutyl ether, tetrahydrothiophene-1,1-dioxide, dimethylsulfoxide, N—N-dimethylacetamide, 4-methylmorpholine, 4-methylmorpholine N-oxide, 4-methoxypyridine-N-oxide hydrate, ammonium hydroxide, tetramethyl ammonium hydroxide, tetraethylammonium hydroxide, mixtures of these, or the like. In a particular embodiment the hydrogen peroxide may have a concentration within the organic solvent of between about 5% and about 20%, such as about 16%. In such an embodiment, the first wet etching process 301 may be continued for a time of between about 60 sec and about 1200 sec, such as about 300 sec. However, any suitable concentration and time may be utilized.

Figure 4:
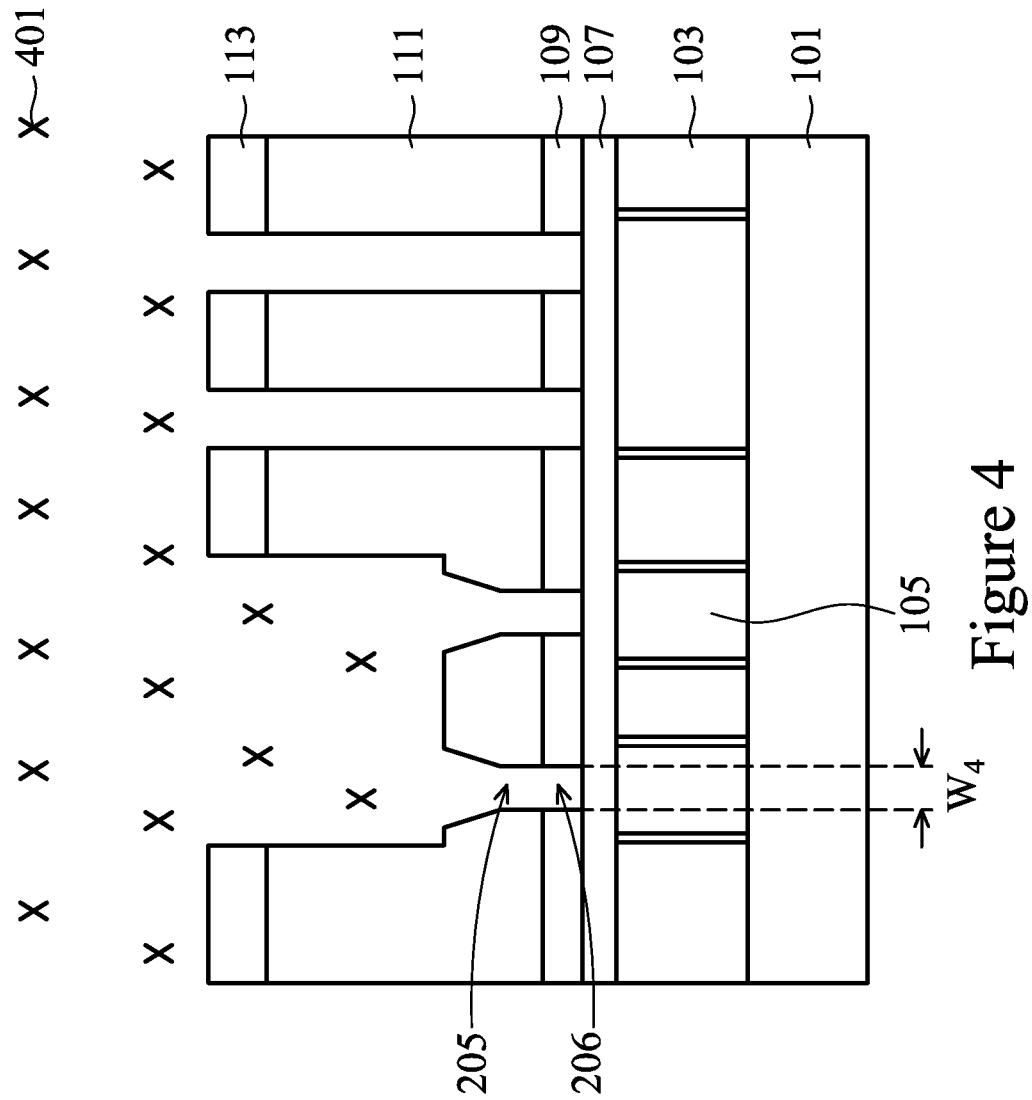
FIG. 4 illustrates an extension of the via openings through an etch stop layer in accordance with some embodiments.

FIG. 4 illustrates that, once the first hardmask 115 has been selectively removed without substantively removing the material of the second etch stop layer 109, the via openings 205 may be extended through the second etch stop layer 109. In an embodiment the breakthrough of the via openings 205 through the second etch stop layer 109 is performed with a second wet etching process (represented in FIG. 4 by the "X"s labeled 401). In an embodiment the second wet etching process 401 may utilize a liquid second etchant which is brought into contact with the second etch stop layer 109 along with the remainder of the structure. For example, the second etch stop layer 109 may be dipped into a liquid pool of the second etchant at a temperature of between about 25° C. and about 80° C., such as about 60° C. However, any suitable method of contacting the second etchant to the second etch stop layer 109 may be utilized.

Additionally, the second etchant is chosen to selectively remove the material of the second etch stop layer 109 (e.g., aluminum oxide) and, in one embodiment, is different from the first etchant and is performed in a separate machine from the first wet etching process 301. As such, while the precise material for the second etchant will depend on the material chosen for the second etch stop layer 109, in an embodiment in which the second etch stop layer 109 is aluminum oxide, the second etchant may comprise a fluoride type component in an aqueous solution. In a particular example, the second etchant may be a kind of ammonium fluoride in an aqueous solution. For example, the second etchant may be ammonium fluoride in an aqueous solution at a concentration of between about 100 ppm and about 1%, such as about 400 ppm. However, any suitable concentration may be utilized.

Additionally, during the extension of the via openings 205 through the second etch stop layer 109, the time of the second wet etch process 401 is controlled to allow the full extension of the via openings 205 through the second etch stop layer 109 while keeping any lateral etching of the second etch stop layer 109 to a minimum. For example, in an embodiment in which the second etch stop layer 109 is aluminum oxide and/or aluminum nitride and the second etchant is ammonium fluoride, the etching process may be performed for a time of between about 10 sec and about 120 sec, such as about 60 sec, although any suitable time may be utilized.

Figure 5:
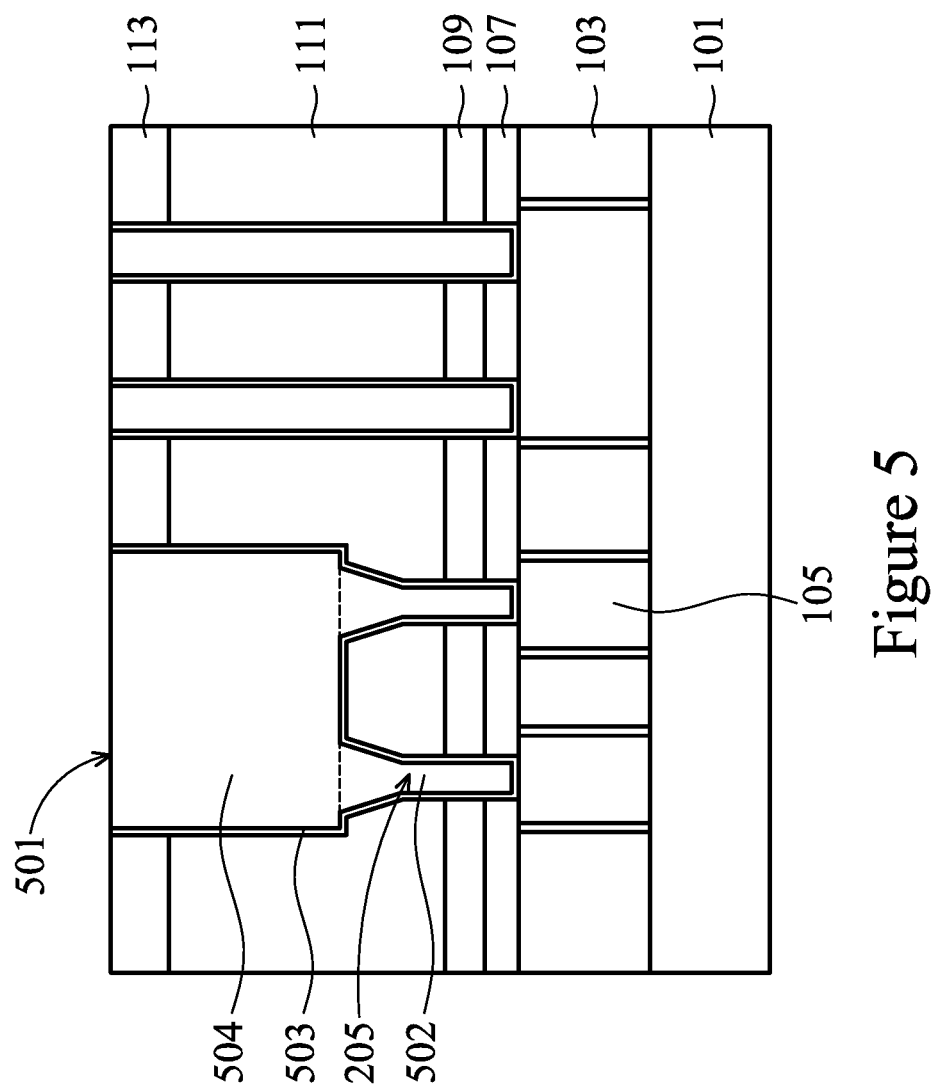
FIG. 5 illustrates a formation of an interconnect in accordance with some embodiments.

FIG. 5 illustrates further processing that may be used to form the interconnect 501. In an embodiment, after the second etch stop layer 109 has been patterned to extend the via openings 205, the via openings 205 may be extended through the first etch stop layer 107. In an embodiment the extension of the via openings 205 through the first etch stop layer 107 exposes the underlying conductive elements 105, and may be performed using, e.g., a wet or dry etching process. However, any suitable patterning or removal process may be utilized.

Once the conductive elements 105 have been exposed, a linear removal may be performed in order to remove any material from the first dielectric layer 111 that may have entered the via openings 205 and to slightly expand the via openings 205 prior to filling. In an embodiment the linear removal may be performed using an etching process such as a wet etch. For example, in an embodiment the linear removal wet etch may use an etchant such ammonium fluoride in order to clean and slightly widen a via bottom 206 such that the via bottom 206 has a fourth width $W_4$ which is larger than the third width $W_3$. In a particular example, the fourth width $W_4$ may be between about 0.5 nm and about 5 nm, such as about 1 nm. However, any suitable dimensions may be used.

Once the conductive elements 105 have been exposed and the optional linear removal has been performed, an optional cleaning process may be performed in order to prepare the surfaces of the via openings 205 and trench opening 119. In an embodiment an optional plasma ashing cleaning process may be utilized prior to the formation of a first barrier layer 503 in order to clean and prepare the sidewalls of the trench opening 119 and the via openings 205 to receive a first barrier layer 503. The plasma ashing cleaning process may be performed by generating a plasma from a cleaning precursor such as oxygen or the like and then exposing the first dielectric layer 111 to the plasma within an inert environment such as nitrogen, argon, or the like. However, any suitable cleaning process may alternatively be utilized.

After the cleaning process has been completed, the first barrier layer 503 may be deposited in order to help isolate and protect a subsequently formed conductive material (discussed further below). In an embodiment the first barrier layer 503 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 503 may be formed to have a thickness of between about 0.1 µm and about 20 µm, such as about 0.5 µm.

Once the first barrier layer 503 has been formed to line the via openings 205 and the trench opening 119, the via openings 205 and the trench opening 119 are filled with a conductive material to form the vias 503 along with the interconnect 501 with a via portion 502 (within the via openings 205) and the trench portion 504 (within the trench opening 119, and illustrated as being separated from the via portion 502 using a dashed line, although there may or may not be a physical indication of the separation). The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the via openings 205 and the trench opening 119. Once the via openings 205 and the trench opening 119 have been filled, excess portions of the first barrier layer 503, the seed layer, and conductive material outside of the via openings 205 and the trench opening 119 may be removed through a planarization process such as chemical mechanical polishing (CMP), although any suitable removal process may be used.

By selectively removing the first hardmask 115 separately from the removal of the second etch stop layer 109, the first hardmask 115 is not located on the structure during a subsequent filling of the trench opening 119 and the via openings 205, thereby improving the gap-fill window. Additionally, the presence of the material of the second etch stop layer (e.g., aluminum oxide) helps to prevent undesired punch through and recessing of the conductive element 205 while also helping to prevent underetching, which would prevent suitable electrical contact.

Additionally, while the removal of the first hardmask 115 and the second etch stop layer 109 have been described above as being removed in separate wet etching machines by separate chemicals, this description is intended be illustrative only and is not intended to be limiting. Rather, any suitable selective removal of the first hardmask 115 and the second etch stop layer 109 may be utilized, such as by using separate chemicals in a single stage, single machine process. Any suitable combination of machines and chemicals may be utilized, and all such combinations are fully intended to be included within the scope of the embodiments.

In accordance with an embodiment, a method of manufacturing a semiconductor device comprising forming an opening through a hardmask layer and a dielectric layer, wherein the opening exposes an etch stop layer and selectively removing the hardmask layer without substantially removing material from the etch stop layer, is provided. After the removing the hardmask layer, a portion of the etch stop layer is selectively removed.

In accordance with another embodiment, a method of manufacturing a semiconductor device comprising depositing a dielectric layer over a first etch stop layer and depositing an anti-reflective layer over the dielectric layer is provided. A hardmask is deposited over the anti-reflective layer, and the hardmask is patterned to form a first opening with a first width. A second opening is formed in the dielectric layer through the first opening, the second opening having a second width equal to the first width, and a third opening is formed through the first opening and the second opening, the third opening exposing the first etch stop layer and having a third width less than the second width. The hardmask is removed with a first removal process that does not substantially remove material from the first etch stop layer, and a portion of the first etch stop layer exposed by the third opening is removed with a second removal process different from the first removal process.

In accordance with yet another embodiment, a method of manufacturing a semiconductor device comprising depositing a first etch stop layer over a conductive region of a substrate and depositing a second etch stop layer over and in physical contact with the first etch stop layer, the second etch stop layer being aluminum oxide is provided. A dielectric layer is deposited over and in physical contact with the second etch stop layer and a nitrogen-free anti-reflective layer is deposited over and in physical contact with the dielectric layer. A hardmask of titanium nitride is deposited and patterned over the nitrogen-free anti-reflective layer, and a trench opening is formed in the dielectric layer, the trench opening having sidewalls aligned with the hardmask, the trench opening having a first width. Via openings are formed through the trench opening in the dielectric layer and partially into the second etch stop layer. The hardmask is removed with a first etch process after the forming the via openings, and the via openings are extended through the second etch stop layer with a second etch process to expose the first etch stop layer, the second etch process being different from the first etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming an opening through a hardmask layer and a dielectric layer, wherein the opening exposes a first etch stop layer over and in physical contact with a second etch stop layer, the forming the opening further comprising:
      forming a trench opening in the dielectric layer;
      forming via openings through the trench opening in the dielectric layer, wherein the via openings extend at least partially within the first etch stop layer;
   selectively removing the hardmask layer without substantially removing material from the first etch stop layer; and
   after the removing the hardmask layer, selectively removing a portion of the first etch stop layer.

2. The method of claim 1, wherein the removing the hardmask layer is performed with a first etchant and the removing the portion of the first etch stop layer is performed with a second etchant different from the first etchant.

3. The method of claim 2, wherein the hardmask layer is titanium nitride.

4. The method of claim 3, wherein the first etch stop layer is aluminum oxide.

5. The method of claim 4, wherein the first etchant comprises hydrogen peroxide.

6. The method of claim 5, wherein the second etchant comprises ammonium fluoride.

7. The method of claim 1, wherein the forming the opening further forms the opening through a nitrogen free anti-reflective layer located between the hardmask layer and the dielectric layer.

8. A method of manufacturing a semiconductor device, the method comprising:
   depositing a dielectric layer over and in physical contact with a first etch stop layer, the first etch stop layer over and in physical contact with a second etch stop layer;
   depositing an anti-reflective layer over the dielectric layer;
   depositing a hardmask over the anti-reflective layer;
   patterning the hardmask to form a first opening with a first width;
   forming a second opening in the dielectric layer through the first opening, the second opening being a trench opening and having a second width equal to the first width;
   forming a third opening through the first opening and the second opening, the third opening being a via opening and exposing the first etch stop layer and having a third width less than the second width, wherein after the forming the third opening the third opening extends partially into the first etch stop layer;
   removing the hardmask with a first removal process that does not substantially remove material from the first etch stop layer, wherein the removing the hardmask is performed after the forming the third opening; and
   removing a portion of the first etch stop layer exposed by the third opening with a second removal process different from the first removal process.

9. The method of claim 8, wherein the first removal process is a wet etch with a first etchant.

10. The method of claim 9, wherein the second removal process is a wet etch with a second etchant different from the first etchant.

11. The method of claim 10, wherein the first etchant comprises is hydrogen peroxide.

12. The method of claim 11, wherein the hardmask is titanium nitride.

13. The method of claim 10, wherein the second etchant comprises ammonium fluoride.

14. The method of claim 13, wherein the first etch stop layer is aluminum oxide.

15. A method of manufacturing a semiconductor device, the method comprising:
   depositing a first etch stop layer over a conductive region of a substrate;
   depositing a second etch stop layer over and in physical contact with the first etch stop layer, the second etch stop layer being aluminum oxide;
   depositing a dielectric layer over and in physical contact with the second etch stop layer;
   depositing a nitrogen-free anti-reflective layer over and in physical contact with the dielectric layer;
   depositing and patterning a hardmask of titanium nitride over the nitrogen-free anti-reflective layer;
   forming a trench opening in the dielectric layer, the trench opening having sidewalls aligned with the hardmask, the trench opening having a first width;
   forming via openings through the trench opening in the dielectric layer and partially into the second etch stop layer;
   removing the hardmask with a first etch process after the forming the via openings; and extending the via openings through the second etch stop layer with a second etch process to expose the first etch stop layer, the second etch process being different from the first etch process.

16. The method of claim 15, wherein the first etch process is performed in a first etching machine and the second etch process is performed in a second etching machine different from the first etching machine.

17. The method of claim 15, wherein the first etch process is performed in a first etching machine and the second etch process is performed in the first etching machine.

18. The method of claim 15, wherein the first etch process is performed with a first etchant comprising hydrogen peroxide.

19. The method of claim 18, wherein the second etch process is performed with a second etchant comprising ammonium fluoride.

20. The method of claim 15, wherein the forming the via openings through the trench opening in the dielectric layer and partially into the second etch stop layer forms the via openings into the second etch stop layer a distance of between about 10 Å and about 200 Å.

* * * * *